US008811830B2

(12) United States Patent
Yoneda et al.

(10) Patent No.: US 8,811,830 B2
(45) Date of Patent: Aug. 19, 2014

(54) MULTI-CHANNEL OPTICAL WAVEGUIDE RECEIVER

(75) Inventors: Yoshihiro Yoneda, Yokohama (JP); Hideki Yagi, Yokohama (JP); Naoko Inoue, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 154 days.

(21) Appl. No.: 13/609,591

(22) Filed: Sep. 11, 2012

(65) Prior Publication Data

US 2013/0071129 A1    Mar. 21, 2013

(30) Foreign Application Priority Data

Sep. 16, 2011    (JP) ................. 2011-203724

(51) Int. Cl.
*H04B 10/00*    (2013.01)
*H04B 10/06*    (2006.01)
(52) U.S. Cl.
USPC .......................................... 398/214; 398/164
(58) Field of Classification Search
USPC .................. 398/164, 202, 208, 214
See application file for complete search history.

(56) References Cited

U.S. PATENT DOCUMENTS

2002/0033979 A1* 3/2002 Dair et al. ...................... 359/152
2009/0087197 A1* 4/2009 Welch ............................ 398/209

FOREIGN PATENT DOCUMENTS

JP    5-158096    6/1993

OTHER PUBLICATIONS

Ikuo Ogawa et al., "Integrated coherent receiver module composed of PLC demodulator and PD array", Proceedings of Institute of Electronics, Information and Communication Engineers (IEICE) General Conference, Electronics 1, p. 239, Mar. 2010 (English translation attached).

* cited by examiner

*Primary Examiner* — Dalzid Singh
(74) *Attorney, Agent, or Firm* — Smith, Gambrell & Russell LLP (57) ABSTRACT

A multi-channel optical waveguide receiver includes an optical input port; an optical branching unit; light-receiving elements having bias electrodes and signal electrodes; optical waveguides being optically coupled between the optical branching unit and the light-receiving elements; capacitors electrically connected between the bias electrodes and a reference potential, the capacitors and the bias electrodes being connected through interconnection patterns; and a signal amplifier including input electrodes. The optical branching unit, the light-receiving elements, the optical waveguides, and the capacitors are formed on a single substrate, the substrate having an edge extending in a first direction. The signal amplifier and the substrate are arranged in a second direction crossing the first direction. The input electrodes and the signal electrodes are arranged along the edge of the substrate. Each of the signal electrodes of the light-receiving elements is electrically connected through a bonding wire to the input electrode.

12 Claims, 6 Drawing Sheets

MULTI-CHANNEL OPTICAL WAVEGUIDE RECEIVER

BACKGROUND OF THE INVENTION

1. Field of the Invention

The present invention relates to a multi-channel optical waveguide receiver.

2. Description of the Related Art

In recent years, optical communication systems having a high bit rate of more than 40 Gb/s have been developed. In addition, the transmission capacity in the optical communication systems is expected to be further increased. For example, an optical transmission system that combines a multilevel modulation technique with a digital coherent receiver technique is proposed. The multilevel modulation technique is characterized by high frequency usage efficiency and high dispersion tolerance in transmission. Quadrature phase-shift keying (QPSK) is an optical transmission system that combines a multilevel modulation technique with a digital coherent receiver technique. Using QPSK enables optical communication having a bit rate of 100 Gb/s or above. Since QPSK signals are transmitted on two polarizations, this modulation technique may be referred to as dual-polarization QPSK (DP-QPSK) or polarization multiplexed QPSK (PM-QPSK).

Such a communication system that combines a multilevel modulation technique with a digital coherent receiver technique requires an optical demodulation circuit and a receiver front end (FE). The optical demodulation circuit has functions to perform delayed treatment on an optical signal, branch the optical signal, and perform phase-shift treatment on the optical signal. The receiver FE includes a multi-channel balanced high-speed optical-to-electrical (O/E) converter.

For example, a patent document (Japanese Unexamined Patent Application Publication No. 5-158096) and a non-patent document (Ogawa, I. et al., "Integrated coherent receiver module composed of PLC demodulator and PD array", Proceedings of the Institute of Electronics, Information and Communication Engineers (IEICE) General Conference, Electronics 1, p. 239, March 2010) disclose optical receivers used for DP-QPSK. Such optical receivers are composed of a polarized beam splitter (PBS) configured to divide an input optical signal into two polarization states orthogonal to each other, a 90-degree optical hybrid configured to cause the optical signal to interfere with local oscillator light, and an OE sub-assembly including a plurality of photodiodes and trans-impedance amplifiers (TIAs).

SUMMARY OF THE INVENTION

Figure 6:
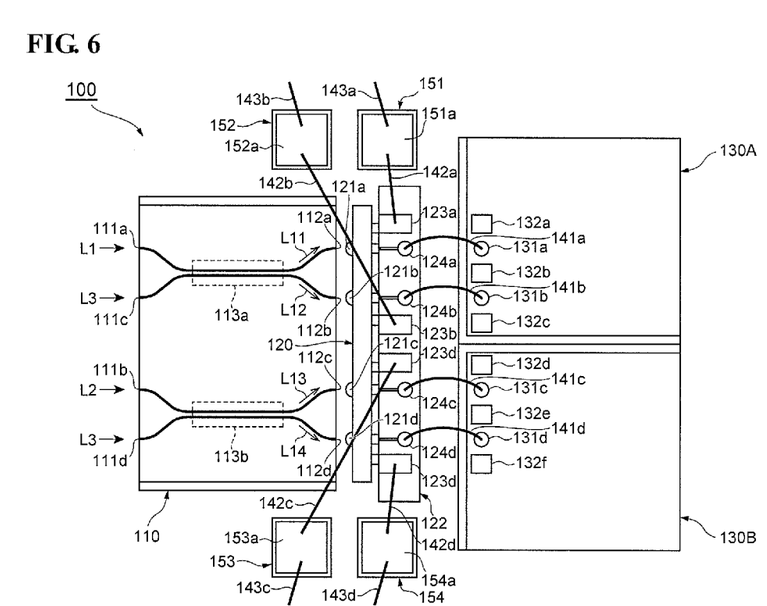
FIG. 6 is a plan view illustrating a configuration of an optical receiver used for DP-QPSK.

FIG. 6 is a plan view illustrating a configuration of an optical receiver used for DP-QPSK. Referring to FIG. 6, an optical receiver 100 includes an optical waveguide substrate 110, a photodiode array 120, and amplifiers (preamplifiers) 130A and 130B.

The optical waveguide substrate 110 includes a silica-based planar lightwave circuit (PLC) and forms a 90-degree optical hybrid. Specifically, the optical waveguide substrate 110 includes an optical input port 111a and an optical input port 111b. Of DP-QPSK-modulated optical signals in two polarization states, an optical signal L1 in one polarization state is input to the optical input port 111a and an optical signal L2 in the other polarization state is input to the optical input port 111b. The optical waveguide substrate 110 further includes optical input ports 111c and 111d to which local oscillator light L3 is input. The optical signals L1 and L2 input to the optical input ports 111a and 111b interfere with the local oscillator light L3 in directional couplers 113a and 113b, respectively, included in the optical waveguide substrate 110. Thus, the optical signals L1 and L2 are divided into four optical signals L11 to L14 that can be detected by coherent detection. The optical signals L11 to L14 are output from output ports 112a to 112d, respectively, of the optical waveguide substrate 110.

The photodiode array 120 includes four photodiodes 121a to 121d each having an incident surface for receiving signal light. The photodiode array 120 is mounted on a photodiode (PD) carrier 122. The photodiodes 121a to 121d are arranged opposite the output ports 112a to 112d, respectively, of the optical waveguide substrate 110 and receive the optical signals L11 to L14 output from the output ports 112a to 112d, respectively. Electrode pads 123a to 123d for supplying direct-current (DC) bias voltages to the photodiodes 121a to 121d, respectively, and electrode pads 124a to 124d for outputting photocurrents generated by the photodiodes 121a to 121d, respectively, are disposed on the PD carrier 122.

The amplifier 130A includes a differential amplification circuit for coherent differential detection, that is, for amplifying the photocurrents output from the photodiodes 121a and 121b and converting them to voltage signals. Similarly, the amplifier 130B includes a differential amplification circuit for amplifying the photocurrents output from the photodiodes 121c and 121d and converting them to voltage signals. Electrode pads 131a and 131b for inputting the photocurrents to the differential amplification circuit are disposed on the surface of the amplifier 130A. Electrode pads 131c and 131d for inputting the photocurrents to the differential amplification circuit are disposed on the surface of the amplifier 130B. The electrode pads 131a to 131d are electrically connected through bonding wires 141a to 141d to the electrode pads 124a to 124d, respectively, on the PD carrier 122. Electrode pads 132a to 132f for reference potentials (ground (GND) potentials) are arranged between the electrode pads 131a to 131d.

Referring to FIG. 6, the optical receiver 100 further includes chip capacitors 151 to 154 that act as bypass capacitors on DC bias voltages. The capacitors 151 and 152 are arranged side by side along one side of the optical waveguide substrate 110 and the PD carrier 122. The capacitors 153 and 154 are arranged side by side along the opposite side of the optical waveguide substrate 110 and the PD carrier 122. The capacitors 151 to 154 each have a pair of electrodes. Electrodes 151a to 154a, each of which is one of the pair of electrodes, are disposed on top faces of the capacitors 151 to 154, respectively. The electrodes 151a to 154a are electrically connected through bonding wires 142a to 142d to the electrode pads 123a to 123d, respectively, on the PD carrier 122. At the same time, the electrodes 151a to 154a are electrically connected through bonding wires 143a to 143d, respectively, to DC power supplies (not shown). Of the pair of electrodes of each of the capacitors 151 to 154, the other electrode (not shown) is connected to the reference potential (GND potential).

The optical receiver 100 configured as described above has the following problems. In the optical receiver 100 used for DP-QPSK, electrical signals output therefrom are high-frequency signals. Therefore, it is preferable that the lengths of signal wiring lines (bonding wires 141a to 141d) for inputting photocurrents from the photodiodes 121a to 121d to the amplifiers 130A and 130B be as small as possible and equal to each other. With the bonding wires 141a to 141d of equal length, it is possible to prevent degradation in frequency response characteristic caused by components with large lead inductance, and to prevent variation in frequency response characteristic among signals.

For the same reason as above, it is preferable that the lengths of the bonding wires 142a to 142d that connect the capacitors 151 to 154 to the photodiodes 121a to 121d, respectively, be as small as possible and equal to each other. However, when, as illustrated in FIG. 6, the capacitors 151 to 154 are arranged along opposite sides of the optical waveguide substrate 110 and the PD carrier 122, the length of the bonding wires 142b and 142c that connect the electrode pads 123b and 123c (located inside) to the capacitors 152 and 153, respectively, is larger than the length of the bonding wires 142a and 142d that connect the electrode pads 123a and 123d (located outside) to the capacitors 151 and 154, respectively. As a result, the frequency response characteristic of signals output from the photodiodes 121b and 121c (located inside) may be degraded by components with large lead inductance. Additionally, since it is difficult to realize the bonding wires 142a to 142d of short and equal length, it is difficult to suppress variation in frequency response characteristic among signals output from the photodiodes 121a to 121d.

One aspect of the present invention relates to a multi-channel optical waveguide receiver. According to one aspect of the present invention, a multi-channel optical waveguide receiver includes an optical input port; an optical branching unit optically coupled to the optical input port; a plurality of light-receiving elements optically coupled to the optical branching unit, each of the light-receiving elements having a bias electrode and a signal electrode; a plurality of optical waveguides, each of the optical waveguides being optically coupled between the optical branching unit and the light-receiving element; a plurality of capacitors electrically connected between the bias electrodes of the light-receiving elements and a reference potential, the capacitors and the bias electrodes being connected through interconnection patterns, respectively; and a signal amplifier amplifying electrical signal output from the light-receiving element, the signal amplifier including a plurality of input electrodes. The optical branching unit, the light-receiving elements, the optical waveguides, and the capacitors are formed on a single substrate, the substrate having an edge extending in a first direction. The signal amplifier and the substrate are arranged in a second direction crossing the first direction, the edge of the substrate and the signal amplifier being opposed to each other. The input electrodes of the signal amplifier and the signal electrodes of the light-receiving elements are arranged along the edge of the substrate. Each of the signal electrodes of the light-receiving elements is electrically connected through a bonding wire to the input electrode of the signal amplifier.

In the multi-channel optical waveguide receiver described above, a plurality of light-receiving elements, a plurality of optical waveguides, and a plurality of capacitors are formed on the single substrate. Each of the optical waveguides is optically coupled between the optical branching unit and the light-receiving element. The capacitors and the bias electrodes of the light-receiving elements are connected through interconnection patterns, respectively. With this arrangement of the light-receiving elements and the capacitors, the lengths of the interconnection patterns are substantially made uniform and short. Therefore, in the multi-channel optical waveguide receiver described above, it is possible to effectively suppress degradation in frequency response characteristics caused by lead inductance components and variation in frequency response characteristics among signals output from light-receiving elements. Furthermore, the substrate has an edge extending in the first direction. The signal amplifier and the substrate are arranged in the second direction crossing the first direction. The edge of the substrate and the signal amplifier are opposed to each other. In addition, the input electrodes of the signal amplifier and the signal electrodes of the light-receiving elements are arranged along the edge of the substrate. Each of the signal electrodes of the light-receiving elements is electrically connected through a bonding wire to the input electrode of the signal amplifier. Therefore, the lengths of the bonding wires connected between the signal electrodes of the light-receiving elements and the input electrodes of the signal amplifier are substantially made uniform and short. As a result, the frequency response characteristics of the multi-channel optical waveguide receiver are further improved.

In the configuration of FIG. 6, where the optical waveguide substrate 110 and the photodiode array 120 are separate, the photodiodes 121a to 121d need to be aligned with the optical axes of the output ports 112a to 112d, respectively, of the optical waveguide substrate 110. This increases the number of steps in manufacture. In contrast, in the multi-channel optical waveguide receiver described above, the optical branching unit and the light-receiving elements are formed on the single substrate. In addition, the optical branching unit and the light-receiving elements are optically coupled through the optical waveguides formed on the single substrate. This can eliminate the need for alignment of the optical axes of the light-receiving elements, and thus can reduce the number of steps in manufacture. Also, the multi-channel optical waveguide receiver of small size can be realized.

In the multi-channel optical waveguide receiver, the signal amplifier preferably includes a plurality of ground electrode pads connected to the reference potential, the input electrodes being arranged between the ground electrode pads of the signal amplifier. The capacitors are electrically connected to the ground electrode pads of the signal amplifier through bonding wires. Therefore, the bonding wires connected between the capacitors and the ground electrode pads of the signal amplifier are arranged along the bonding wires connected between the signal electrodes of the light-receiving elements and the input electrodes of the signal amplifier, respectively. High-frequency signals pass through the bonding wires connected between the signal electrodes of the light-receiving elements and the input electrodes of the signal amplifier. Therefore, noise on the high-frequency signals can be reduced.

In the multi-channel optical waveguide receiver, the light-receiving elements are preferably interposed between the capacitors in the first direction. In addition, the capacitors may be arranged side by side with the light-receiving elements, respectively, in the first direction. Using these configurations enhance the effect of the reduction of noise on the high-frequency signals.

In the multi-channel optical waveguide receiver, the capacitors may extend in the second direction and include electrodes connected to the bias electrodes of the light-receiving elements, the electrodes connected to the bias electrodes extending in the second direction away from the edge of the substrate. Distances between the edge of the substrate and ends of electrodes of the capacitors connected to the bias electrodes in the second direction are preferably different from each other. By positioning the electrodes of the capacitors connected to the bias electrodes of the light-receiving as described above, bonding wires connected between the electrodes of the capacitors and bias voltage sources can be prevented from crossing each other.

In the multi-channel optical waveguide receiver, the capacitors preferably include two metal layers and an insulating layer interposed between the two metal layers.

In the multi-channel optical waveguide receiver, the interconnection patterns connected between the capacitors and the bias electrodes of the light-receiving elements preferably have a substantially equal length.

In the multi-channel optical waveguide receiver, the signal amplifier may be composed of a differential-amplifier. The capacitors may be arranged toward the light-receiving elements in the first direction.

Another aspect of the present invention relates to a multi-channel optical waveguide receiver for an optical signal containing first to fourth signal components modulated by quadrature phase-shift keying. According to another aspect of the present invention, a multi-channel optical waveguide receiver includes an optical input port to which the optical signal is input; an optical branching unit optically coupled to the input port, the optical branching unit dividing the optical signal into the first to fourth signal components; first to fourth light-receiving elements that generate electrical signals corresponding to optical intensities of the first to fourth signal components, respectively, output from the optical branching unit, the light-receiving elements each having first to fourth bias electrodes and first to fourth signal electrodes; first to fourth optical waveguides optically coupled between the optical branching unit and the light-receiving elements, respectively; first to fourth capacitors electrically connected between the bias electrodes of the light-receiving elements and a reference potential, the capacitors and the bias electrodes being connected through first to fourth interconnection patterns, respectively; and a signal amplifier amplifying the electrical signals output from the light-receiving elements, the signal amplifier including first to fourth input electrodes. The optical branching unit, the light-receiving elements, the optical waveguides, and the capacitors are formed on a single substrate, the substrate having an edge extending in a first direction. The signal amplifier and the substrate are arranged in a second direction crossing the first direction, the edge of the substrate and the signal amplifier being opposed to each other. The first to fourth input electrodes of the signal amplifier and the first to fourth light-receiving elements are arranged along the edge of the substrate. The signal electrodes of the light-receiving elements are electrically connected through first to fourth bonding wires to the first to fourth input electrodes, respectively, of the signal amplifier. In addition, the first to fourth capacitors are arranged side by side with the first to fourth light-receiving elements, respectively, in the first direction.

In the multi-channel optical waveguide receiver, the signal amplifier preferably includes a plurality of ground electrode pads connected to the reference potential, the input electrodes being arranged between the ground electrode pads of the signal amplifier. The capacitors are electrically connected to the ground electrode pads of the signal amplifier through fifth to eighth bonding wires. In addition, the fifth to eighth bonding wires are disposed along the first to fourth bonding wires, respectively.

In the multi-channel optical waveguide receiver, the first and second capacitors may be arranged opposite each other in the first direction. The third and fourth capacitors may be arranged opposite each other in the first direction. The first and second light-receiving elements may be interposed between the first and second capacitors in the first direction. In addition, the third and fourth light-receiving elements may be interposed between the third and fourth capacitors in the first direction.

DESCRIPTION OF THE PREFERRED EMBODIMENTS

Embodiments of a multi-channel optical waveguide receiver according to the present invention will now be described in detail with reference to the attached drawings. In the description of the drawings, the same components are given the same reference numerals and overlapping descriptions will be omitted.

Figure 1:
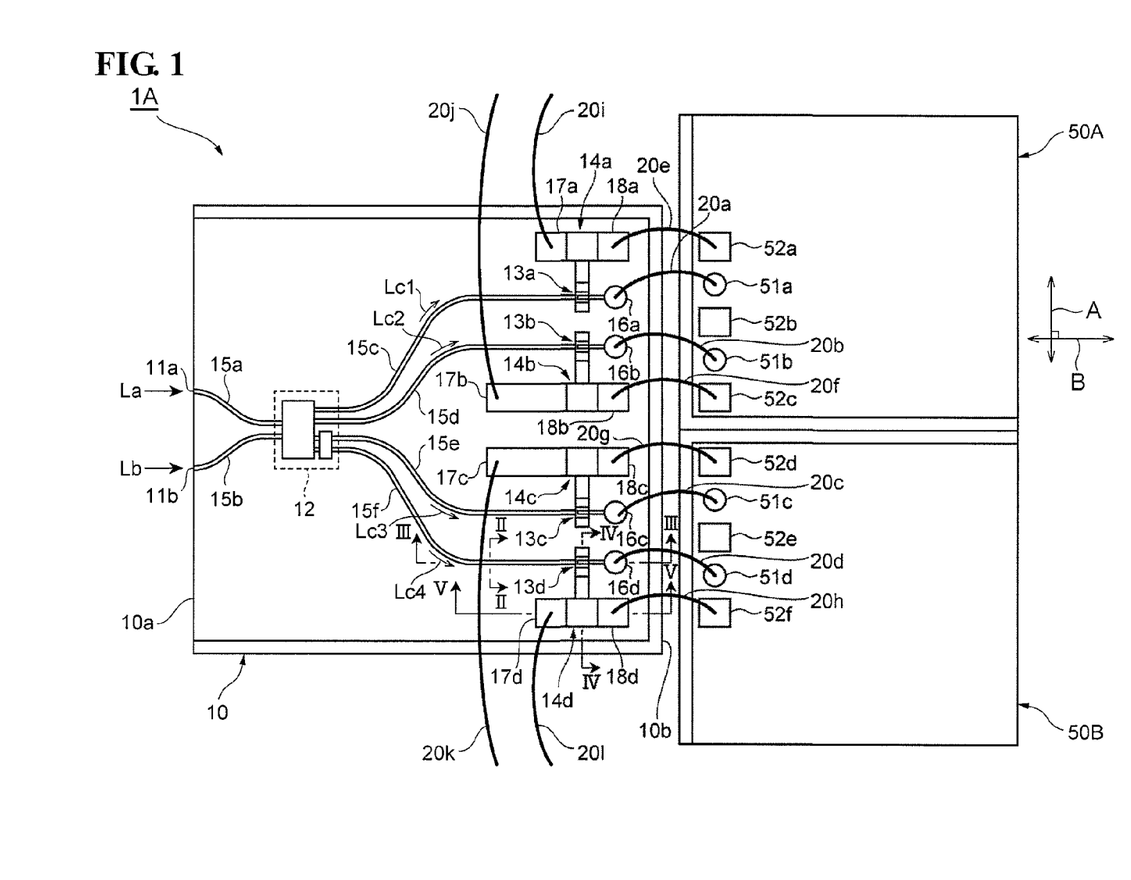
FIG. 1 is a plan view illustrating a configuration of a multi-channel optical waveguide receiver according to an embodiment of the present invention.
Figure 2:
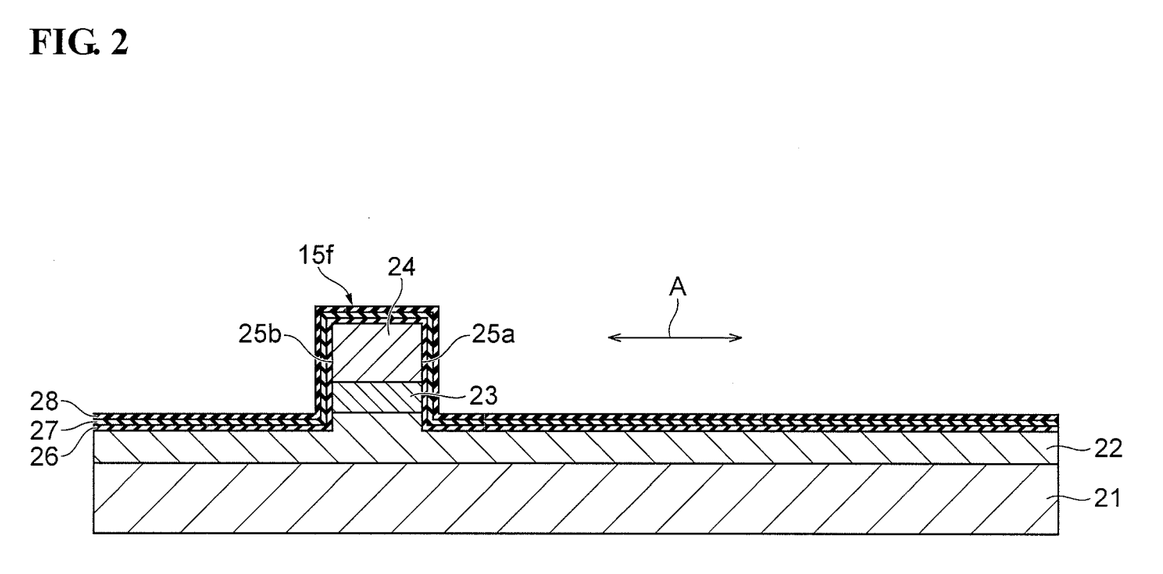
FIG. 2 is a cross-sectional view taken along line II-II of FIG. 1.
Figure 3:
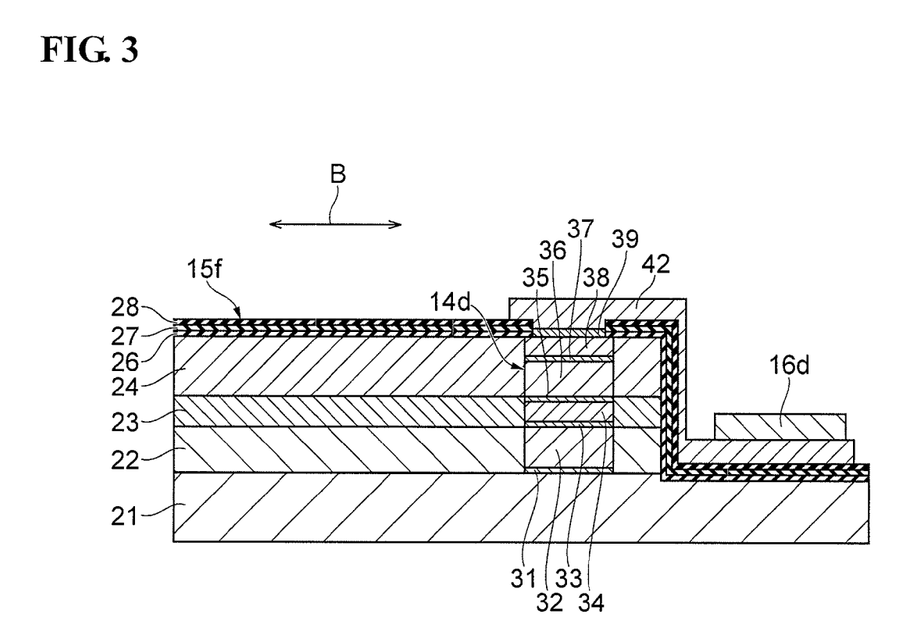
FIG. 3 is a cross-sectional view taken along line III-III of FIG. 1.
Figure 4:
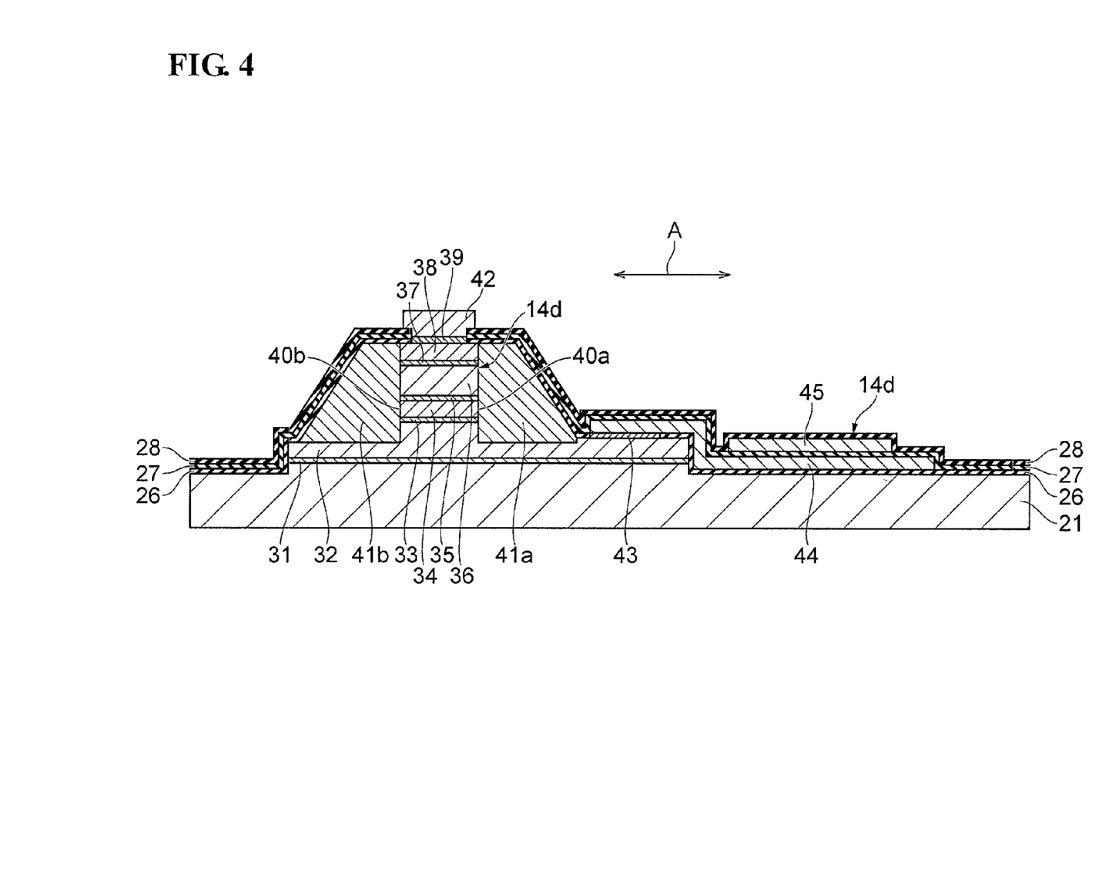
FIG. 4 is a cross-sectional view taken along line IV-IV of FIG. 1.
Figure 5:
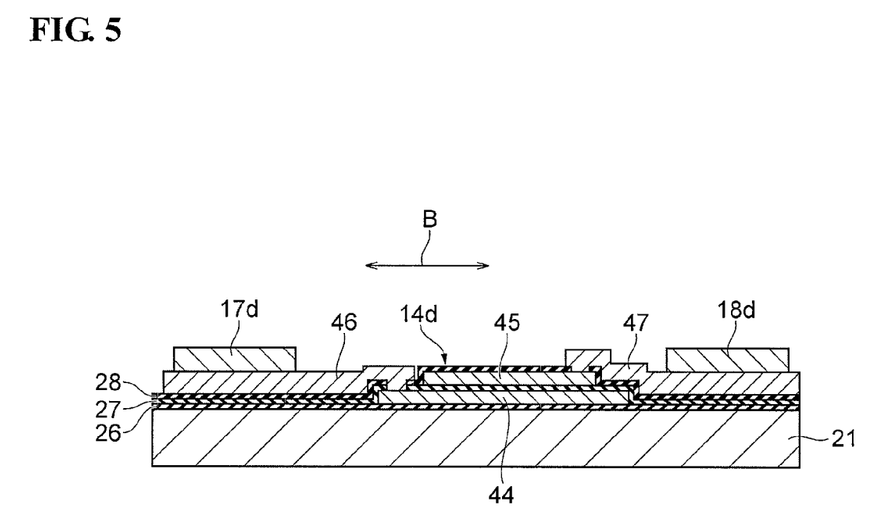
FIG. 5 is a cross-sectional view taken along line V-V of FIG. 1.

FIG. 1 is a plan view illustrating a configuration of a multi-channel optical waveguide receiver (hereinafter simply referred to as "optical receiver") according to an embodiment of the present invention. FIG. 2 is a cross-sectional view taken along line II-II of FIG. 1. FIG. 3 is a cross-sectional view taken along line III-III of FIG. 1. FIG. 4 is a cross-sectional view taken along line IV-IV of FIG. 1. FIG. 5 is a cross-sectional view taken along line V-V of FIG. 1.

As illustrated in FIG. 1, an optical receiver 1A of the present embodiment includes an optical waveguide substrate 10 and signal amplifiers 50A and 50B. The optical waveguide substrate 10 is produced by forming optical waveguides on a compound semiconductor substrate, such as an indium phosphide (InP) substrate. The optical waveguide substrate 10 includes two optical input ports 11a and 11b and an optical branching unit (optical coupler) 12. The optical waveguide substrate 10 further includes first to fourth light-receiving elements 13a to 13d and first to fourth capacitors 14a to 14d formed thereon.

The optical waveguide substrate 10 has a pair of edges 10a and 10b that extend in a direction A. In the embodiment, the direction A is a first direction. The two optical input ports 11a and 11b are located on one (edge 10a) of the edges 10a and 10b of the optical waveguide substrate 10. An optical signal La containing four signal components (first to fourth signal components) modulated by QPSK is input from outside the optical receiver 1A to one (optical input port 11a) of the two optical input ports 11a and 11b. Local oscillator light Lb is input to the other optical input port 11b. The optical input ports 11a and 11b are optically coupled through optical waveguides 15a and 15b, respectively, to the optical branching unit 12. The optical waveguides 15a and 15b each suitably include a core and a cladding that covers the core. The core is made of a material (e.g., indium gallium arsenide phosphide (InGaAsP)) having a relatively high refractive index. The cladding is made of a material (e.g., InP) having a refractive index lower than that of the core.

The optical branching unit 12 forms a 90-degree optical hybrid. That is, the optical branching unit 12 is formed by a multimode interference (MMI) coupler. The optical branching unit 12 causes the optical signal La and the local oscillator light Lb to interfere with each other. Thus, the optical branching unit 12 divides the optical signal La into four signal components Lc1 to Lc4 modulated by QPSK. Of the four signal components Lc1 to Lc4, the signal components Lc1 and Lc2 are in the same polarization state and have an in-phase relationship. The signal components Lc3 and Lc4 are in the same polarization state, which differs from that of the signal components Lc1 and Lc2. The signal components Lc3 and Lc4 have a quadrature relationship.

The light-receiving elements 13a to 13d each are composed of a PIN photodiode. The light-receiving elements 13a to 13d are arranged in this order along the edge 10b of the optical waveguide substrate 10. The light-receiving elements 13a to 13d are optically coupled through optical waveguides 15c to 15f, respectively, to respective four output terminals of the optical branching unit 12. Constant bias voltages are supplied to respective cathodes of the light-receiving elements 13a to 13d. The light-receiving elements 13a to 13d receive the signal components Lc1 to Lc4, respectively, from the optical branching unit 12 and generate electrical signals (photocurrents) corresponding to respective optical intensities of the signal components Lc1 to Lc4. Electrode pads 16a to 16d for the outputs of the electrical signals are electrically connected to anodes of the light-receiving elements 13a to 13d, respectively. The electrode pads 16a to 16d are disposed on the optical waveguide substrate 10, and are arranged along the edge 10b of the optical waveguide substrate 10 in the direction A. The electrode pads 16a to 16d are electrically connected through bonding wires 20a to 20d to electrode pads 51a to 51d, respectively, of the signal amplifiers 50A and 50B. Note that the bonding wires 20a to 20d of the present embodiment correspond to first to fourth bonding wires, respectively.

The capacitors 14a to 14d each suitably include, for example, two metal layers stacked on the optical waveguide substrate 10 and an insulating layer interposed between the two metal layers. The capacitors 14a to 14d are arranged side by side with (or arranged adjacent to) the light-receiving elements 13a to 13d, respectively, in the direction A. The capacitors 14a to 14d are electrically connected between the respective reference potential lines (GND lines) and cathodes of the light-receiving elements 13a to 13d to which bias voltages are supplied. That is, one of the two metal layers is connected to the cathode of each of the light-receiving elements 13a to 13d and the other metal layer is connected to the reference potential line (GND line). In the present embodiment, the light-receiving elements 13a and 13b are interposed between the capacitors 14a and 14b in the direction A, and the light-receiving elements 13c and 13d are interposed between the capacitors 14c and 14d in the direction A.

The capacitors 14a to 14d include electrode pads 17a to 17d for applying bias voltage, respectively. The capacitors 14a to 14d further include electrode pads 18a to 18d connected to the reference potential line (GND line), respectively. The electrode pads 17a to 17d each are connected to the one metal layer. The electrode pads 18a to 18d each are connected to the other metal layer. The electrode pads 18a to 18d are interposed between the electrode pads 17a to 17d, respectively, and the edge 10b of the optical waveguide substrate 10 in a direction B that crosses the direction A. In the embodiment, the direction B is a second direction. As shown in FIG. 1, the optical waveguide substrate 10 and signal amplifiers 50A and 50B are arranged in a direction B. The edge 10b of the optical waveguide substrate 10 and an edge of the signal amplifier are opposed to each other. The electrode pads 18a to 18d extend in the direction toward the edge 10b, whereas the electrode pads 17a to 17d extend in the direction away from the edge 10b.

Bonding wires 20i to 20l are connected at one end to the electrode pads 17a to 17d, respectively, and electrically connected at the other end to respective bias voltage sources (not shown). The length of the electrode pads 17b and 17c in the direction B is larger than that of the electrode pads 17a and 17d in the direction B. In other words, the distance between the edge 10b of the optical waveguide substrate 10 and the edges of the electrode pads 17b and 17c in the direction B is larger than that between the edge 10b and the edges of the electrode pads 17a and 17d in the direction B.

Bonding wires 20e to 20h are connected at one end to the electrode pads 18a to 18d, respectively. The bonding wires 20e to 20h are disposed along the bonding wires 20a to 20d, respectively. The bonding wires 20e to 20h are connected at the other end to ground electrode pads 52a, 52c, 52d, and 52f, respectively, of the signal amplifiers 50A and 50B. The ground electrode pads 52a, 52c, 52d, and 52f are connected to the reference potential line (GND line), respectively. Note that the bonding wires 20e to 20h of the present embodiment correspond to fifth to eighth bonding wires, respectively. Also note that the bonding wires 20i to 20l of the present embodiment correspond to ninth to twelfth bonding wires, respectively. The bonding wires 20i to 20l form parts of first to fourth wiring lines, respectively, that supply bias voltages to the light-receiving elements 13a to 13d, respectively.

The signal amplifiers 50A and 50B are amplifiers (preamplifiers) that amplify electrical signals (photocurrents) output from the light-receiving elements 13a to 13d. The signal amplifier 50A includes the electrode pads 51a and 51b to input electrical signals (photocurrents). The signal amplifier 50A is composed of a differential-amplifier which amplifies the electrical signals input to the electrode pads 51a and 51b to generate one voltage signal. The signal amplifier 50B includes the electrode pads 51c and 51d. The signal amplifier 50B is also composed of a differential-amplifier which amplifies the electrical signals input to the electrode pads 51c and 51d to generate one voltage signal. The electrode pads 51a to 51d are arranged in this order in the direction A along the edge 10b of the optical waveguide substrate 10. As described above, the electrode pads 51a to 51d are electrically connected through the bonding wires 20a to 20d to the electrode pads 16a to 16d, respectively. In the present embodiment, the electrode pads 51a and 51b correspond to first and second input electrodes, respectively. The electrode pads 51c and 51d correspond to third and fourth input electrodes, respectively.

The signal amplifier 50A further includes the ground electrode pads 52a to 52c connected to the reference potential line (GND line), respectively. The ground electrode pads 52a to 52c are arranged in this order in the direction A along the edge 10b of the optical waveguide substrate 10. The electrode pad 51a is interposed between the ground electrode pads 52a and 52b. The electrode pad 51b is interposed between the ground electrode pads 52b and 52c. Similarly, the signal amplifier 50B further includes the ground electrode pads 52d to 52f connected to the reference potential line (GND line), respectively. The ground electrode pads 52d to 52f are arranged in this order in the direction A along the edge 10b of the optical waveguide substrate 10. The electrode pad 51c is interposed between the ground electrode pads 52d and 52e. The electrode pad 51d is interposed between the ground electrode pads 52e and 52f. As described above, the ground electrode pads 52a, 52c, 52d, and 52f of the signal amplifiers 50A and 50B are electrically connected through the bonding wires 20e to 20h to the electrode pads 18a to 18d, respectively.

Cross-sectional structures of the light-receiving elements 13a to 13d, the capacitors 14a to 14d, and the optical waveguides 15a to 15f will be described in detail with reference to FIG. 2 to FIG. 5.

First, a cross-sectional structure of the optical waveguides 15a to 15f will be described. FIG. 2 illustrates a cross-sectional structure of the optical waveguide 15f perpendicular to the optical waveguide direction. The optical waveguide direction corresponds approximately to the direction B (i.e., to the second direction) in the embodiment. FIG. 3 illustrates a cross section of the optical waveguide 15f along the optical waveguide direction. Note that the other optical waveguides 15a to 15e have the same cross-sectional structure as that of the optical waveguide 15f.

Referring to FIG. 2 and FIG. 3, the optical waveguide 15f has a structure obtained by forming a buffer layer 22, an optical-waveguide core layer 23, and a cladding layer 24, in this order, on a substrate 21. The substrate 21 and the buffer layer 22 are made of, for example, semi-insulating InP. The optical-waveguide core layer 23 is made of a material (e.g., InGaAsP) that has a refractive index higher than that of the buffer layer 22 and can be lattice-matched to the buffer layer 22. For example, InGaAsP of the optical-waveguide core layer 23 has a band-gap wavelength of 1.05 μm. The cladding layer 24 is made of a material (e.g., undoped InP) that has a refractive index lower than that of the optical-waveguide core layer 23 and can be lattice-matched to the optical-waveguide core layer 23. A part of the buffer layer 22, the optical-waveguide core layer 23, and the cladding layer 24 form a mesa structure that extends in an optical waveguide direction. The mesa structure has a pair of side faces 25a and 25b. This mesa structure allows optical signals to propagate within the optical-waveguide core layer 23 in the optical waveguide 15f. The pair of side faces 25a and 25b and the top face of the mesa structure are covered with three insulating films 26 to 28. The insulating films 26 to 28 are, for example, dielectric films made of silicon mononitride (SiN), silicon oxynitride (SiON), or silicon dioxide (SiO$_2$).

Next, a cross-sectional structure of the light-receiving elements 13a to 13d will be described. FIG. 3 illustrates a cross section of the light-receiving element 13d along the optical waveguide direction. FIG. 4 illustrates a cross section of the light-receiving element 13d perpendicular to the optical waveguide direction. Note that the other light-receiving elements 13a to 13c have the same cross-sectional structure as that of the light-receiving element 13d.

Referring to FIG. 3 and FIG. 4, the light-receiving element 13d includes an etch stop layer 31, an n-type buffer layer 32, an n-type intermediate layer 33, an optical absorption layer 34, an i-type or p-type intermediate layer 35, a p-type cladding layer 36, a p-type intermediate layer 37, and a p-type contact layer 38 stacked in this order on the substrate 21. The n-type intermediate layer 33 is formed to reduce the hetero-barrier at the hetero-junction of the n-type buffer layer 32 and the optical absorption layer 34. The i-type or p-type intermediate layer 35 is formed to reduce the hetero-barrier at the hetero-junction of the optical absorption layer 34 and the p-type cladding layer 36. The p-type intermediate layer 37 is formed to reduce the hetero-barrier at the hetero-junction of the p-type cladding layer 36 and the p-type contact layer 38. The etch stop layer 31 is made of, for example, undoped InGaAsP and has a band-gap wavelength of, for example, 1.15 μm. The n-type buffer layer 32 is made of, for example, silicon (Si)-doped InP. The n-type intermediate layer 33 is made of, for example, Si-doped InGaAsP and has a band-gap wavelength of, for example, 1.4 μm. The optical absorption layer 34 is made of, for example, undoped indium gallium arsenide (InGaAs) lattice matched to InP. The i-type or p-type intermediate layer 35 includes, for example, two undoped or zinc (Zn)-doped InGaAsP layers having band-gap wavelengths of, for example, 1.3 μm and 1.1 μm. The p-type cladding layer 36 is made of, for example, Zn-doped InP. The p-type intermediate layer 37 includes, for example, two Zn-doped InGaAsP layers having band-gap wavelengths of, for example, 1.1 μm and 1.3 μm. The p-type contact layer 38 is made of, for example, Zn-doped InGaAs.

As illustrated in FIG. 4, a part of the n-type buffer layer 32, the n-type intermediate layer 33, the optical absorption layer 34, the i-type or p-type intermediate layer 35, the p-type cladding layer 36, the p-type intermediate layer 37, and the p-type contact layer 38 form a mesa structure that extends in an optical waveguide direction (i.e., in the direction B in the present embodiment). The mesa structure has a pair of side faces 40a and 40b. The n-type intermediate layer 33, the optical absorption layer 34, and the i-type or p-type intermediate layer 35 are in contact with the optical-waveguide core layer 23 of the optical waveguide 15f at one end in the optical waveguide direction, and are optically coupled to the optical-waveguide core layer 23. The pair of side faces 40a and 40b of the mesa structure are embedded by buried portions 41a and 41b, respectively. The buried portions 41a and 41b are made of semi-insulating material, such as iron (Fe)-doped InP.

The light-receiving element 13d further includes the insulating films 26 to 28, which are common to those of the optical waveguides 15a to 15f. The insulating films 26 to 28 extend from the top face of the mesa structure over the buried portions 41a and 41b. The insulating films 26 to 28 have an opening in the top face of the mesa structure. An ohmic electrode 39 is disposed on the p-type contact layer 38 exposed from the insulating films 26 to 28 through the opening. In the embodiment, the ohmic electrode 39 is a signal electrode of the light-receiving element 13d. The ohmic electrode 39 is made of, for example, gold-zinc (AuZn) or platinum (Pt). An interconnection pattern 42 is disposed on the ohmic electrode 39. As illustrated in FIG. 3, the interconnection pattern 42 extends in the optical waveguide direction (i.e., in the direction B) to electrically connect the ohmic electrode 39 to the electrode pad 16d. For example, the interconnection pattern 42 has a laminated structure with titanium-tungsten (TiW)/gold (Au) layers, TiW/Pt/Au layers, or titanium (Ti)/Pt/Au layers. The electrode pad 16d is formed by, for example, Au plating.

As illustrated in FIG. 4, the insulating film 26 has another opening on the n-type buffer layer 32, the opening being away from the mesa structure of the light-receiving element 13d. An ohmic electrode 43 is disposed on the n-type buffer layer 32 exposed from the insulating film 26 through the opening. In the embodiment, the ohmic electrode 43 is a bias electrode of the light-receiving element 13d. The ohmic electrode 43 is made of, for example, gold-germanium (AuGe) or gold-germanium-nickel (AuGeNi). A lower metal layer 44 extending from the capacitor 14d is on the ohmic electrode 43.

Next, a cross-sectional structure of the capacitors 14a to 14d will be described. FIG. 4 illustrates a cross section of the capacitor 14d perpendicular to the optical waveguide direction. FIG. 5 illustrates a cross section of the capacitor 14d along the optical waveguide direction. Note that the other capacitors 14a to 14c have the same cross-sectional structure as that of the capacitor 14d.

Referring to FIG. 4 and FIG. 5, the capacitor 14d includes the insulating film 26, the lower metal layer 44, the insulating film 27, an upper metal layer 45, and the insulating film 28 stacked in this order on the substrate 21. For example, the lower metal layer 44 and the upper metal layer 45 have a metal laminated structure with TiW/Au layers, TiW/Pt/Au layers, or Ti/Pt/Au layers. The insulating films 26 to 28 are common to those of the light-receiving elements 13a to 13d and the optical waveguides 15a to 15f. The insulating films 26 to 28 are, for example, dielectric films made of SiN, SiON, or $SiO_2$. Thus, the capacitor 14d has a so-called metal-insulator-metal (MIM) structure in which the insulating film 27 is interposed between the lower metal layer 44 and the upper metal layer 45.

As illustrated in FIG. 5, the upper metal layer 45 is smaller in dimension than the lower metal layer 44 in the direction along the surface of the substrate 21. The insulating films 27 and 28 have an opening on a part of the lower metal layer 44 not covered by the upper metal layer 45. An interconnection pattern 46 is disposed on the lower metal layer 44 exposed from this opening. In the optical waveguide direction (i.e., in the direction B), the interconnection pattern 46 extends in a direction away from the edge 10b of the optical waveguide substrate 10 so as to electrically connect the lower metal layer 44 to the electrode pad 17d. The insulating film 28 that covers the upper metal layer 45 has another opening. An interconnection pattern 47 is disposed on the upper metal layer 45 exposed from this opening. In the optical waveguide direction (i.e., in the direction B), the interconnection pattern 47 extends in a direction toward the edge 10b of the optical waveguide substrate 10 so as to electrically connect the upper metal layer 45 to the electrode pad 18d. For example, the interconnection patterns 46 and 47 have a laminated structure with TiW/Au layers, TiW/Pt/Au layers, or Ti/Pt/Au layers. The electrode pad 17d and the electrode pad 18d are formed, for example, by Au plating.

An effect achieved by the optical receiver 1A of the present embodiment configured as described above will now be described.

In the optical receiver 1A, the light-receiving elements 13a to 13d and the capacitors 14a to 14d are formed on the common optical waveguide substrate 10. The light-receiving elements 13a to 13d are arranged along the edge 10b that extends in the direction A. The capacitors 14a to 14d are arranged side by side with the light-receiving elements 13a to 13d, respectively, in the direction A. With this arrangement of the light-receiving elements 13a to 13d and the capacitors 14a to 14d, the lengths of the interconnection patterns between the capacitors and the respective light-receiving elements can be made uniform and shorter than those in the configuration of FIG. 6, where the capacitors 151 to 154 are arranged along opposite sides of the optical waveguide substrate 110. Therefore, in the optical receiver 1A according to the present embodiment, it is possible to effectively suppress degradation in frequency response characteristic caused by lead inductance components and variation in frequency response characteristic among signals output from light-receiving elements.

In the configuration of FIG. 6, where the optical waveguide substrate 110 and the photodiode array 120 are separate, the photodiodes 121a to 121d need to be aligned with the optical axes of the output ports 112a to 112d, respectively, of the optical waveguide substrate 110. This increases the number of steps in manufacture. In contrast, in the optical receiver 1A of the present embodiment, the optical branching unit 12, the optical waveguides 15c to 15f, and the light-receiving elements 13a to 13d are formed on the common optical waveguide substrate 10. The optical waveguides 15c to 15f are optically coupled to the optical branching unit 12 and the light-receiving elements 13a to 13d, respectively. The optical branching unit 12 divides the optical signal La modulated by QPSK into the signal components Lc1 to Lc4. The light-receiving elements 13a to 13d generate electrical signals corresponding to the optical intensities of the signal components Lc1 to Lc4 propagating through the optical waveguides 15c to 15f, respectively. This enables to eliminate the steps of aligning the optical axes between the light-receiving elements and the optical waveguides. Also, the optical receiver 1A of small size can be realized.

In the optical receiver 1A described above, the electrode pads 51a to 51d of the signal amplifiers 50A and 50B are arranged along the edge 10b of the optical waveguide substrate 10. At the same time, the electrode pads 16a to 16d of the light-receiving elements 13a to 13d are connected through the bonding wires 20a to 20d to the electrode pads 51a to 51d, respectively, of the signal amplifiers 50A and 50B. In this case, the lengths of the bonding wires 20a to 20d can be as small as possible. And the bonding wires 20a to 20d have the same length. As a result, high frequency response characteristics are obtained because of a decrease in the lead inductance components. In addition, uniform frequency response characteristics among signals output from light-receiving elements are also obtained. Additionally, the electrode pads 18a to 18d of the capacitors 14a to 14d are connected to the ground electrode pads 52a, 52c, 52d, and 52f of the signal amplifiers 50A and 50B, through the bonding wires 20e to 20h arranged along the bonding wires 20a to 20d, respectively. The electrode pads of the signal amplifiers 50A and 50B, light-receiving elements 13a to 13d, and capacitors 14a to 14d are arranged and connected through the bonding wires 20a to 20h as described above. Thus, the bonding wires 20a to 20d through which high-frequency signals pass can be interposed between the bonding wires 20e to 20h serving as reference potential lines. This can reduce noise on high-frequency signals. In particular, in the present embodiment, the light-receiving elements 13a and 13b are interposed between the capacitors 14a and 14b in the direction A, and the light-receiving elements 13c and 13d are interposed between the capacitors 14c and 14d in the direction A. Using this configuration enhances the effect described above.

As in the present embodiment, it is preferable that the distance between the edge 10b of the optical waveguide substrate 10 and the edges of the electrode pads 17b and 17c of the capacitors 14b and 14c in the direction B be larger than the distance between the edge 10b and the edges of the electrode pads 17a and 17d of the capacitors 14a and 14d in the direction B. By positioning the edges of the electrode pads 17a to 17d of the capacitors 14a to 14d as described above, the bonding wires 20i to 20l can be prevented from crossing each other.

The multi-channel optical waveguide receiver according to the present invention is not limited to the embodiments described above and various modifications can be made. For example, although a semi-insulating substrate is used as the substrate 21 in the embodiments described above, an insulating substrate may be used as the substrate 21 instead of the semi-insulating substrate. In the embodiments described above, the conductivity type of layers arranged lower position than an active layer (i.e., layers adjacent to the substrate 21) is n-type, whereas the conductivity type of layers arranged higher position than the active layer is p-type. However, these conductivity types may be reversed. That is, even if the conductivity type of layers arranged lower position than the active layer (i.e., layers adjacent to the substrate 21) is p-type and the conductivity type of layers arranged higher position than the active layer is n-type, it is possible to suitably achieve the effect of the present invention.

In the embodiments described above, the optical waveguides and the first to fourth light-receiving elements are made of InP semiconductor. However, the type of semiconductor that forms the optical waveguides and the first to fourth light-receiving elements is not limited to this. For example, the optical waveguides and the first to fourth light-receiving elements may be made of gallium arsenide (GaAs) semiconductor.

Although the present invention has been specifically described on the basis of the embodiments, the present invention is not limited to the embodiments and may be changed without departing from the scope of the present invention.

What is claimed is:

1. A multi-channel optical waveguide receiver comprising:
    an optical input port;
    an optical branching unit optically coupled to the optical input port;
    a plurality of light-receiving elements optically coupled to the optical branching unit, each of the light-receiving elements having a bias electrode and a signal electrode;
    a plurality of optical waveguides, each of the optical waveguides being optically coupled between the optical branching unit and the light-receiving element;
    a plurality of capacitors electrically connected between the bias electrodes of the light-receiving elements and a reference potential, the capacitors and the bias electrodes being connected through interconnection patterns, respectively; and
    a signal amplifier amplifying electrical signal output from the light-receiving element, the signal amplifier including a plurality of input electrodes,
    wherein the optical branching unit, the light-receiving elements, the optical waveguides, and the capacitors are formed on a single substrate, the substrate having an edge extending in a first direction,
    the signal amplifier and the substrate are arranged in a second direction crossing the first direction, the edge of the substrate and the signal amplifier being opposed to each other;
    the input electrodes of the signal amplifier and the signal electrodes of the light-receiving elements are arranged along the edge of the substrate;
    each of the signal electrodes of the light-receiving elements is electrically connected through a bonding wire to the input electrode of the signal amplifier.

2. The multi-channel optical waveguide receiver according to claim 1, wherein the signal amplifier includes a plurality of ground electrode pads connected to the reference potential, the input electrodes being arranged between the ground electrode pads of the signal amplifier,
    the capacitors are electrically connected to the ground electrode pads of the signal amplifier through bonding wires, and
    the bonding wires connected between the capacitors and the ground electrode pads of the signal amplifier are arranged along the bonding wires connected between the signal electrodes of the light-receiving elements and the input electrodes of the signal amplifier, respectively.

3. The multi-channel optical waveguide receiver according to claim 1, wherein the light-receiving elements are interposed between the capacitors in the first direction.

4. The multi-channel optical waveguide receiver according to claim 1, wherein the capacitors are arranged side by side with the light-receiving elements, respectively, in the first direction.

5. The multi-channel optical waveguide receiver according to claim 1, wherein the capacitors extend in the second direction and include electrodes connected to the bias electrodes of the light-receiving elements, the electrodes connected to the bias electrodes extending in the second direction away from the edge of the substrate, distances between the edge of the substrate and ends of electrodes of the capacitors connected to the bias electrodes in the second direction are different from each other.

6. The multi-channel optical waveguide receiver according to claim 1, wherein the capacitors include two metal layers and an insulating layer interposed between the two metal layers.

7. The multi-channel optical waveguide receiver according to claim 1, wherein the interconnection patterns connected between the capacitors and the bias electrodes of the light-receiving elements have a substantially equal length.

8. The multi-channel optical waveguide receiver according to claim 1, wherein the signal amplifier is composed of a differential-amplifier.

9. The multi-channel optical waveguide receiver according to claim 1, wherein the capacitors are arranged toward the light-receiving elements in the first direction.

10. A multi-channel optical waveguide receiver for an optical signal containing first to fourth signal components modulated by quadrature phase-shift keying comprising:
    an optical input port to which the optical signal is input;
    an optical branching unit optically coupled to the input port, the optical branching unit dividing the optical signal into the first to fourth signal components;
    first to fourth light-receiving elements that generate electrical signals corresponding to optical intensities of the first to fourth signal components, respectively, output from the optical branching unit, the light-receiving elements each having first to fourth bias electrodes and first to fourth signal electrodes;
    first to fourth optical waveguides optically coupled between the optical branching unit and the light-receiving elements, respectively;
    first to fourth capacitors electrically connected between the bias electrodes of the light-receiving elements and a reference potential, the capacitors and the bias electrodes being connected through first to fourth interconnection patterns, respectively; and
    a signal amplifier amplifying the electrical signals output from the light-receiving elements, the signal amplifier including first to fourth input electrodes,
    wherein the optical branching unit, the light-receiving elements, the optical waveguides, and the capacitors are formed on a single substrate, the substrate having an edge extending in a first direction;
    the signal amplifier and the substrate are arranged in a second direction crossing the first direction, the edge of the substrate and the signal amplifier being opposed to each other;
    the first to fourth input electrodes of the signal amplifier and the first to fourth light-receiving elements are arranged along the edge of the substrate;
    the signal electrodes of the light-receiving elements are electrically connected through first to fourth bonding wires to the first to fourth input electrodes, respectively, of the signal amplifier; and
    the first to fourth capacitors are arranged side by side with the first to fourth light-receiving elements, respectively, in the first direction.

11. The multi-channel optical waveguide receiver according to claim 10, wherein the signal amplifier includes a plurality of ground electrode pads connected to the reference potential, the input electrodes being arranged between the ground electrode pads of the signal amplifier,
  the capacitors are electrically connected to the ground electrode pads of the signal amplifier through fifth to eighth bonding wires, and
  the fifth to eighth bonding wires are disposed along the first to fourth bonding wires, respectively.

12. The multi-channel optical waveguide receiver according to claim 10, wherein the first and second capacitors are arranged opposite each other in the first direction,
  the third and fourth capacitors are arranged opposite each other in the first direction,
  the first and second light-receiving elements are interposed between the first and second capacitors in the first direction, and
  the third and fourth light-receiving elements are interposed between the third and fourth capacitors in the first direction.

* * * * *